United States Patent
Lee (10) Patent No.: US 7,329,919 B2
(45) Date of Patent: Feb. 12, 2008

(54) NON-VOLATILE MEMORY DEVICE AND METHOD OF MANUFACTURING THE SAME

(75) Inventor: Sang-Bum Lee, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 33 days.

(21) Appl. No.: 11/320,588

(22) Filed: Dec. 30, 2005

(65) Prior Publication Data
US 2007/0102751 A1 May 10, 2007

(30) Foreign Application Priority Data
Oct. 14, 2005 (KR) .................. 10-2005-0097009

(51) Int. Cl.
*H01L 29/76* (2006.01)
(52) U.S. Cl. .................. 257/314; 257/296; 257/302; 257/324; 257/E27.084
(58) Field of Classification Search ............. 257/331, 257/315
See application file for complete search history.

(56) References Cited

U.S. PATENT DOCUMENTS

| 5,929,477 A * | 7/1999 | McAllister Burns et al. .... 257/306 |
| 6,373,099 B1 * | 4/2002 | Kikuchi et al. ............. 257/331 |
| 7,244,987 B2 * | 7/2007 | Forbes ..................... 257/324 |

* cited by examiner

*Primary Examiner*—Wai-Sing Louie
(74) *Attorney, Agent, or Firm*—Lowe Hauptman Ham & Berner LLP (57) ABSTRACT

A non-volatile memory device and a method of manufacturing the same where the non-volatile memory device is easily applicable to higher integration of a semiconductor device by reducing a cell size while assuring storage capacities required for operations of a device. The non-volatile memory device includes a semiconductor substrate in which an active region is defined by an isolation layer and a protruding portion is formed on the active region, a source region formed on the protruding portion, first and second gates formed at both sidewalls of the protruding portion and the source region, first and second drain regions formed in the active region at the outside of the first and second gates, and an insulation layer formed between the first and second gates and the protruding portion and the source region.

9 Claims, 13 Drawing Sheets

NON-VOLATILE MEMORY DEVICE AND METHOD OF MANUFACTURING THE SAME

CROSS-REFERENCE TO RELATED APPLICATION

This application claims priority to and the benefit of Korean Patent Application No. 10-2005-0097009 filed in the Korean Intellectual Property Office on Oct. 14, 2005, the entire contents of which are incorporated herein by reference.

BACKGROUND OF THE INVENTION (a) Field of the Invention

The present invention relates to a method of manufacturing a semiconductor device. More particularly, the present invention relates to a SONOS non-volatile memory device and a method of manufacturing the same.

(b) Description of the Related Art

Generally, since a non-volatile memory device has several merits, such as a small cell size, fast erasing and programming operation, and long-term capacity of data storage, then a non-volatile memory device is frequently used as a signaling transistor in a personal digital assistant (PDA), a digital camera, a personal communication system (PCS), and a smart card, or as a memory device as a substitute for a dynamic random access memory (DRAM).

Such non-volatile memory devices are classified into a floating-gate-based memory and a Metal Insulator Semiconductor (MIS) based memory.

A floating-gate-based memory device realizes its memory characteristics using a potential well. On the other hand, an MIS-based memory device having double or triple dielectric layers realizes its memory characteristics using a trap that exists at each interface between dielectric bulk, between dielectric layers, and between a dielectric layer and a semiconductor. Therefore, an MIS-based memory device is more applicable to low voltage and high speed than a floating-gate-based memory device.

As typical MIS-based memory devices, there are Metal Oxide Nitride Oxide Silicon (MONOS) and Silicon Oxide Nitride Oxide Silicon (SONOS) devices which are mainly used as Electrically Erasable Programmable Read Only Memory (EEPROMs).

When a programming operation in a MONOS or SONOS non-volatile memory device is performed, a threshold voltage is increased by trapping electrons within a trap site at a nitride layer through Fowler-Nordheim (FN) tunneling or direct tunneling. Similarly, in the case of an erasing operation therein, a threshold voltage is decreased by releasing electrons out to a substrate through FN tunneling, direct tunneling, or trap-assisted tunneling.

A conventional method of manufacturing a SONOS non-volatile memory device will hereinafter be described in detail with reference to FIG. 1A to FIG. 1E and FIG. 2A to FIG. 2E.

FIG. 1A to FIG. 1E and FIG. 2A to FIG. 2E are cross-sectional views and top plan views showing a conventional method of manufacturing a non-volatile memory device.

Figure 1A:
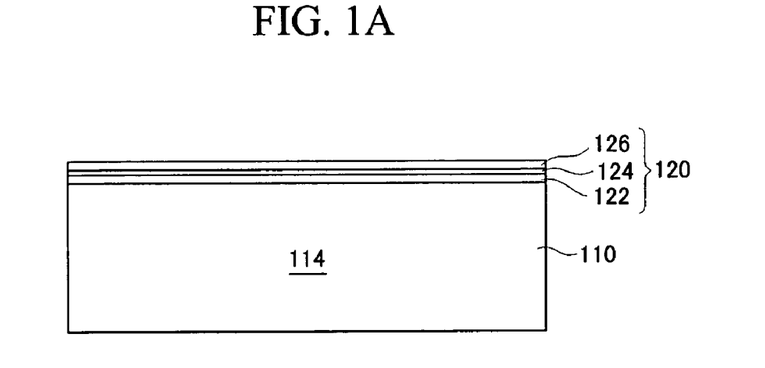
FIG. 1A to FIG. 1E. are cross-sectional views showing a conventional method of manufacturing a non-volatile memory device.
Figure 2A:
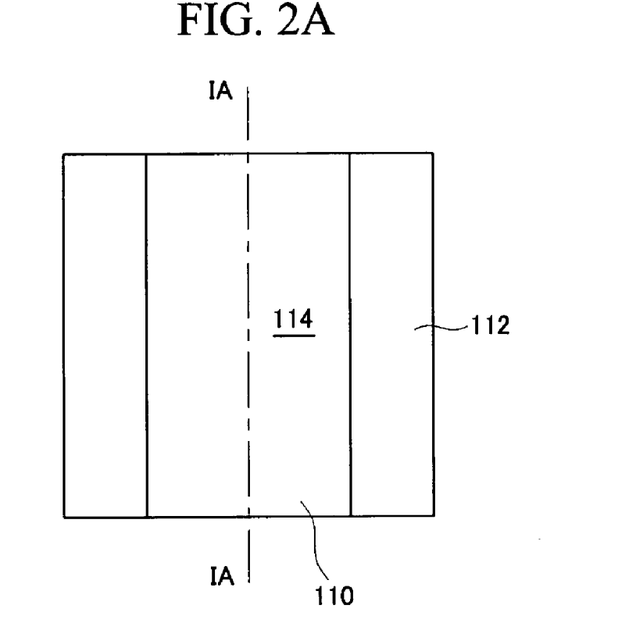
FIG. 2A to FIG. 2E are top plan views showing a conventional method of manufacturing a non-volatile memory device.

Referring to FIG. 1A and FIG. 2A, a mask pattern (not shown) comprised of a pad oxide layer and pad nitride layer is formed on a semiconductor substrate 110, and a trench (not shown) is formed by etching a portion of the substrate 110 exposed by a mask pattern. Subsequently, an oxide layer is deposited so as to fill the trench, and then an isolation layer 112 is formed by planarizing the oxide layer through a chemical mechanical polishing (CMP) process and by removing the mask pattern. Consequently, an active region 114 is defined on the semiconductor substrate 110 by forming the isolation layer 112.

Thereafter, although not shown, a well region and a threshold voltage adjusting layer are formed on the substrate 110 by performing ion implantation for a well and threshold voltage adjustment. Then, an ONO insulation layer 120 is formed by sequentially depositing a first oxide layer 122, a nitride layer 124, and a second oxide layer 126 on the substrate 110.

Figure 1B:
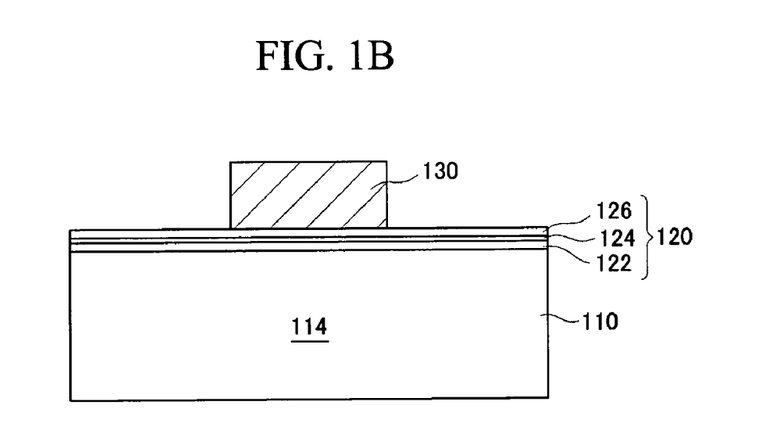
Figure 2B:
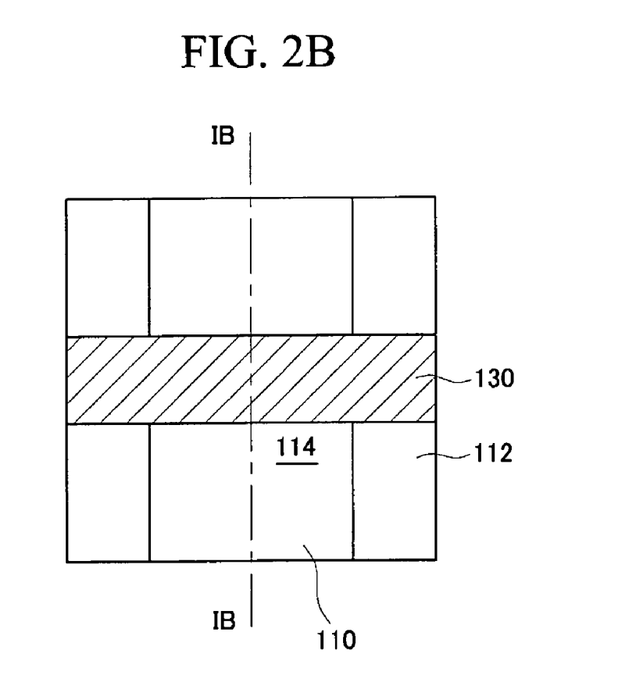

Referring to FIG. 1B and FIG. 2B, a gate 130 is formed by patterning a polysilicon layer (not shown) deposited on the insulation layer 120.

Figure 1C:
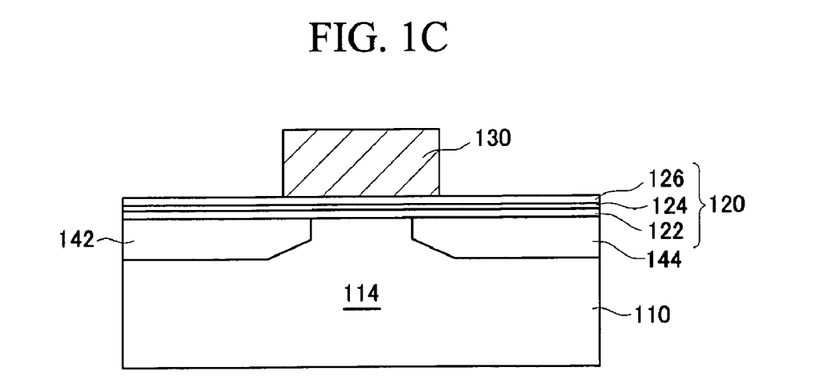
Figure 2C:
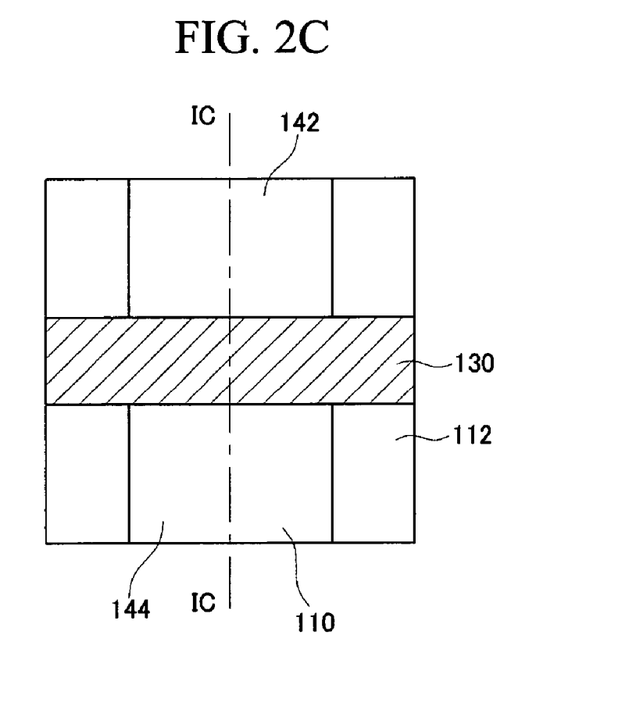

Referring to FIG. 1C and FIG. 2C, LDD (Lightly Doped Drain) regions 142 and 144 are formed in the active region 114 at both sides of the gate 130 by ion-implanting LDD ions into the substrate 110.

Figure 1D:
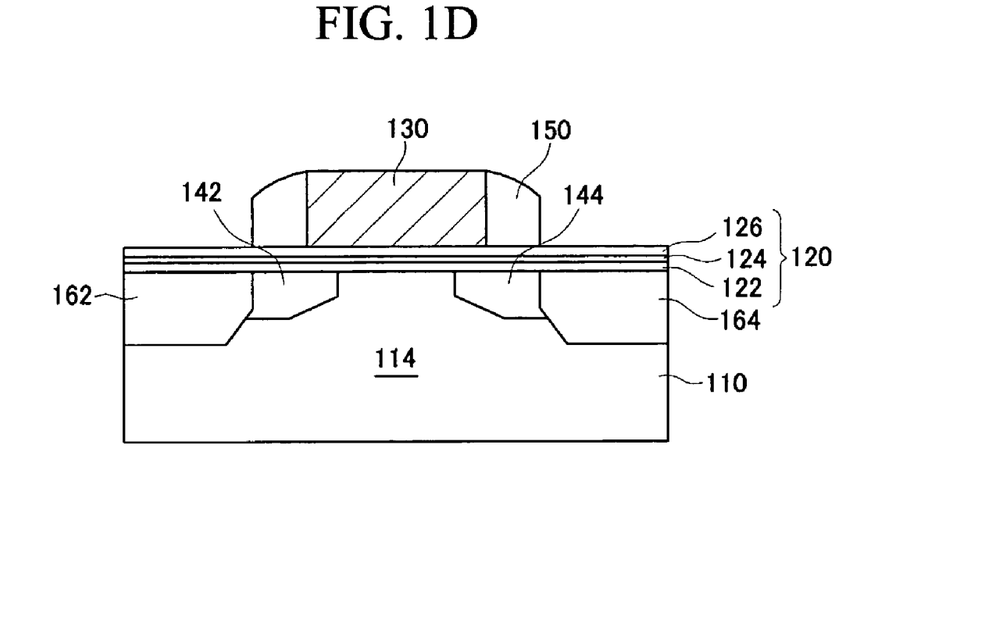
Figure 2D:
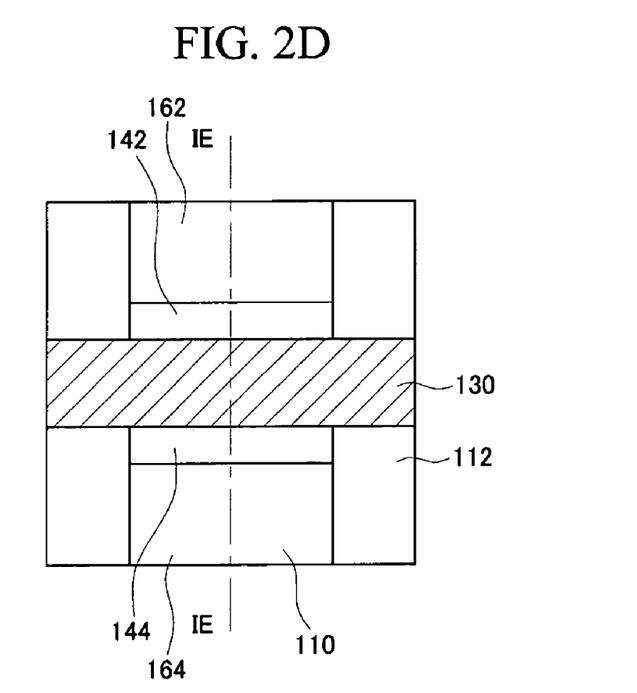

Referring to FIG. 1D and FIG. 2D, an insulation layer which is composed of an oxide layer, a nitride layer, or a composite layer thereof is deposited on an entire surface of the substrate 110, and then a spacer 150 is formed at both sidewalls of the gate 130 by performing blanket etching for the insulation layer to a degree that the gate 130 is exposed.

Subsequently, source and drain regions 162 and 164 are formed in the active region 114 at both sides of the spacer 150 by ion-implanting high concentration impurities into the substrate 110.

Figure 1E:
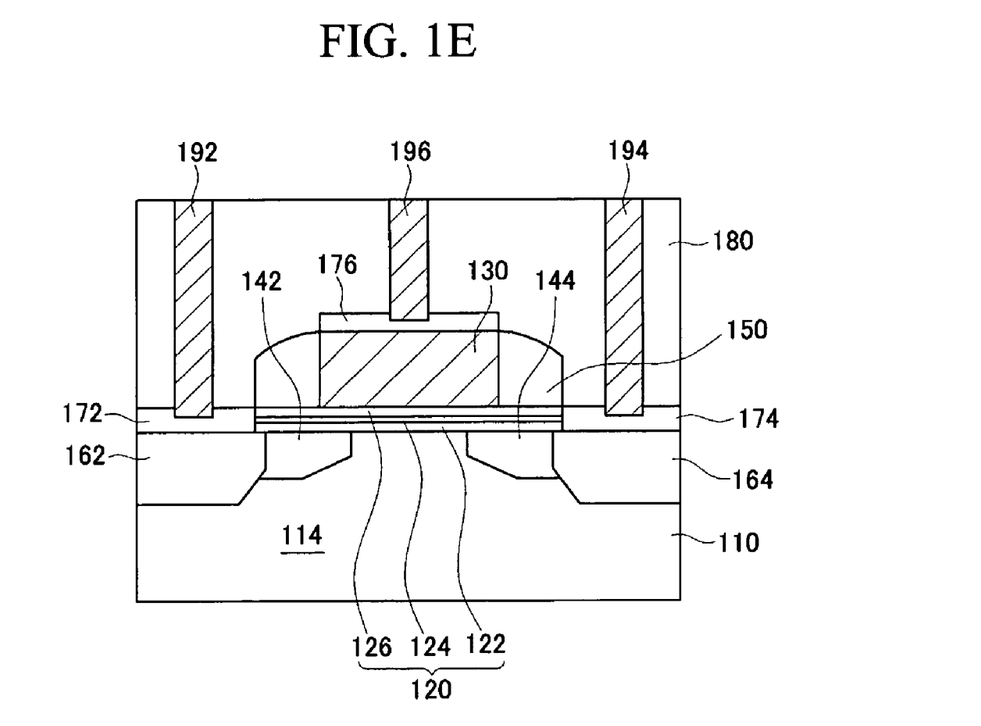
Figure 2E:
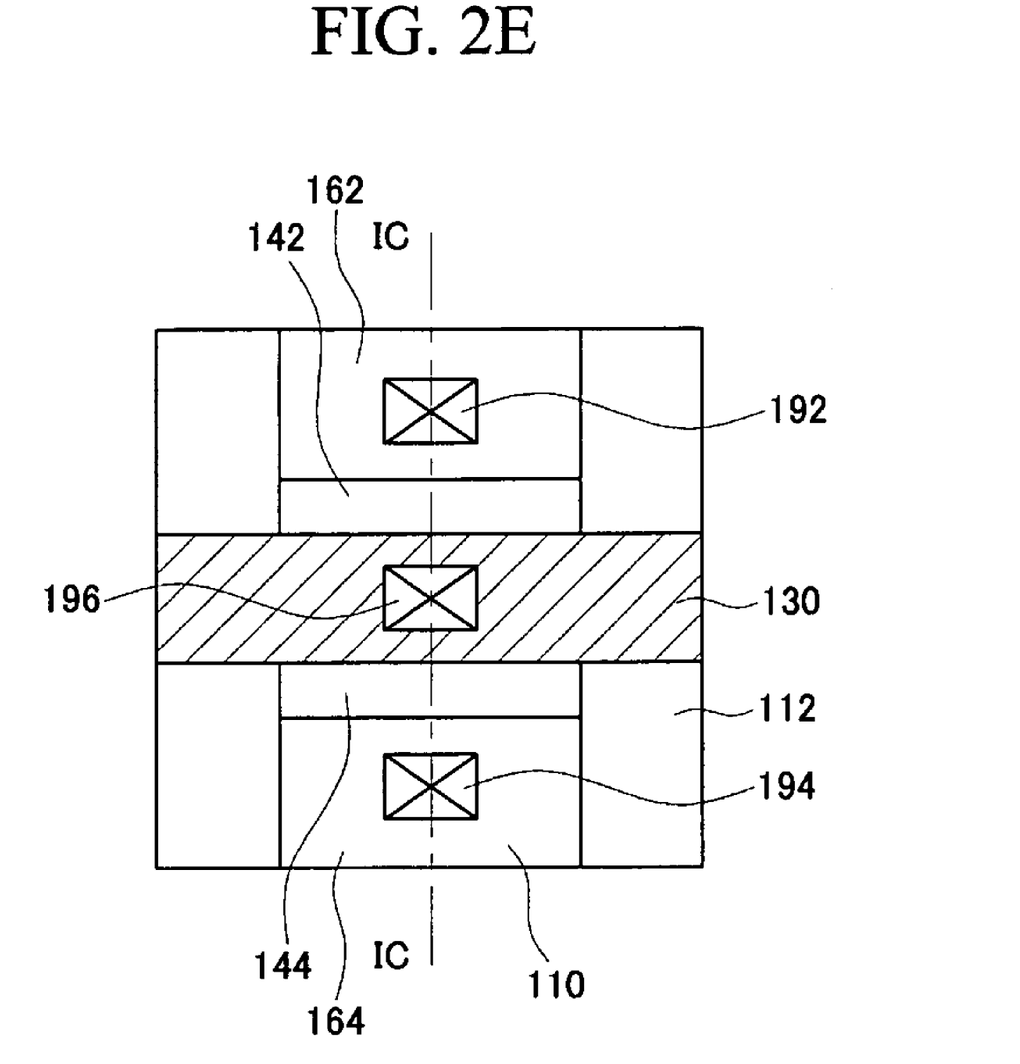

Referring to FIG. 1E and FIG. 2E, silicide layers 172, 174, and 176 are formed on the source and drain regions 162 and 164 and the gate 130 by performing a well-known salicide (self-aligned silicide) process, and then an interlayer insulation layer 180 is formed on the entire surface of the substrate 110. Subsequently, contact holes (not shown) are formed by etching the interlayer insulation layer 180 on the silicide layers 172, 174, and 176, and then conductive contact plugs 192, 194, and 196 are formed by filling the contact holes. The conductive contact plugs 192, 194, and 196 respectively contact the source and drain regions 162 and 164 and the gate 130 through the silicide layers 172, 174, and 176.

However, since a conventional method of manufacturing a non-volatile memory device has a limit for reducing a cell size while assuring storage capacities required for operations of devices, it is not easily applicable to higher integration of the semiconductor device.

The above information disclosed in this Background section is only for enhancement of understanding of the background of the invention and therefore it may contain information that does not form part of the prior art with respect to the present invention.

SUMMARY OF THE INVENTION

The present invention has been made in an effort to provide a non-volatile memory device and method of manufacturing the same having a advantage that the non-volatile memory device which is easily applicable to higher integration of a semiconductor device can be manufactured by reducing a cell size while assuring storage capacities required for operations of a device.

An exemplary non-volatile memory device according to an embodiment of the present invention includes: a semiconductor substrate in which an active region is defined by an isolation layer and a protruding portion is formed on the active region; a source region formed on the protruding portion; first and second gates formed at both sidewalls of the protruding portion and the source region; first and second drain regions formed in the active region at the outside of the first and second gates; and an insulation layer formed between the protruding portion and the first gate, between the protruding portion and the second gate, between the source region and the first gate, and between the source region and the second gate.

An exemplary method of manufacturing a non-volatile memory device according to an embodiment of the present invention includes: defining an active region in a semiconductor substrate by forming an isolation layer; forming a source region in the active region; forming a structure in which a polysilicon layer pattern and a protective layer are sequentially accumulated on the source region; forming a protruding portion below the source region by etching a portion of the substrate exposed by the structure; forming an insulation layer on an entire surface of the substrate; respectively forming first and second gates on the insulation layer at both sides of the structure, at the source region and the protruding portion; respectively forming first and second drain regions on the active region at the outside of the first and second gates; forming an interlayer insulation layer on the entire surface of the substrate; forming contact holes by etching the interlayer insulation layer on the first and second drain regions, the protective layer and the interlayer insulation layer on the source region, and the interlayer insulation layer on the first and second gates; and forming conductive contact plugs which contact the first and second drain regions, the source region, and the first and second gates through the contact holes.

Here, the insulation layer can be composed of the structure in which a first oxide layer, a nitride layer, and a second oxide layer are sequentially accumulated.

DETAILED DESCRIPTION OF THE EMBODIMENTS

An exemplary embodiment of the present invention will hereinafter be described in detail with reference to the accompanying drawings.

FIG. 3A to 3G and FIG. 4A to FIG. 4G are cross-sectional views and top plan views showing a method of manufacturing a non-volatile memory device according to an exemplary embodiment of the present invention.

Figure 3A:
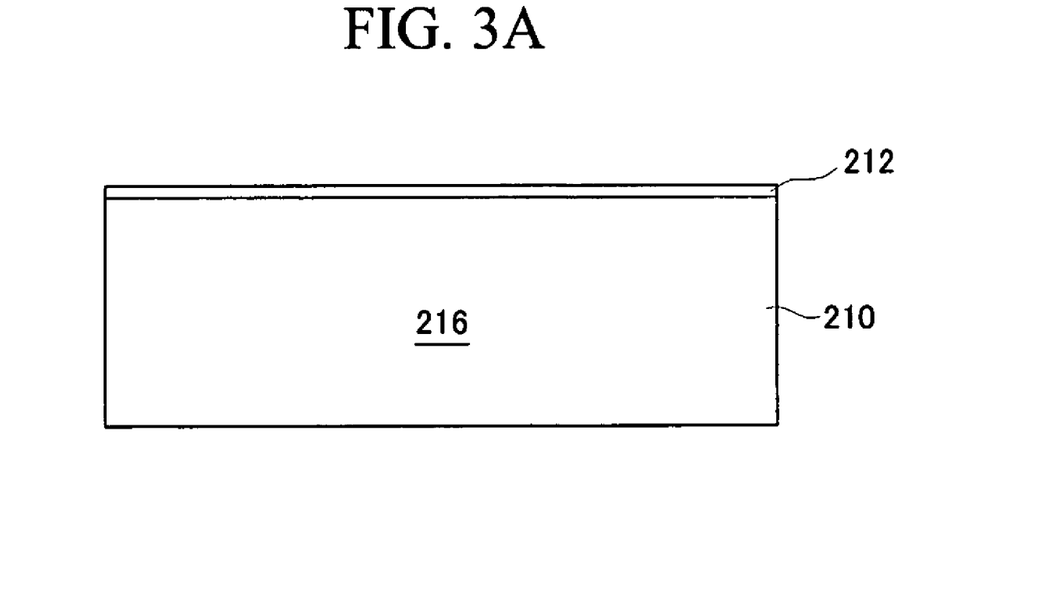
FIG. 3A to FIG. 3G are cross-sectional views showing a method of manufacturing a non-volatile memory device according to an exemplary embodiment of the present invention.
Figure 4A:
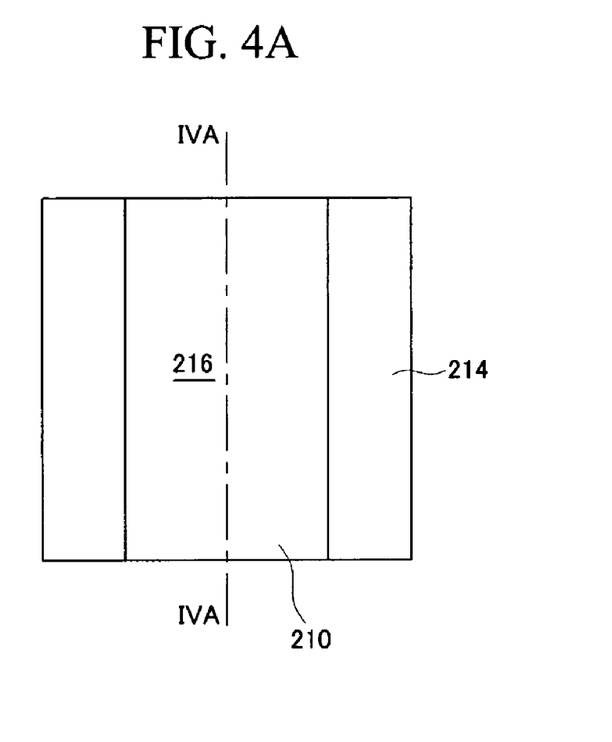
FIG. 4A to FIG. 4G are top plan views showing a method of manufacturing a non-volatile memory device according to an exemplary embodiment of the present invention.

Referring to FIG. 3A and FIG. 4A, a mask pattern (not shown) composed of a pad oxide layer and a pad nitride layer is formed on a semiconductor substrate 210, and a trench (not shown) is formed by etching a portion of the substrate 210 exposed by the mask pattern.

Subsequently, an oxide layer is deposited so as to fill the trench, and an isolation layer 214 is formed by planarizing the oxide layer through a chemical mechanical polishing (CMP) process and by removing the mask pattern. Consequently, an active region 216 is defined on the semiconductor substrate 110 by forming the isolation layer 214. Thereafter, a pad oxide layer 212 is formed on the substrate 210, and then, although not shown, a well region and a threshold voltage adjusting layer are formed on the substrate 210 by performing ion implantation for a well and threshold voltage adjustment.

Figure 3B:
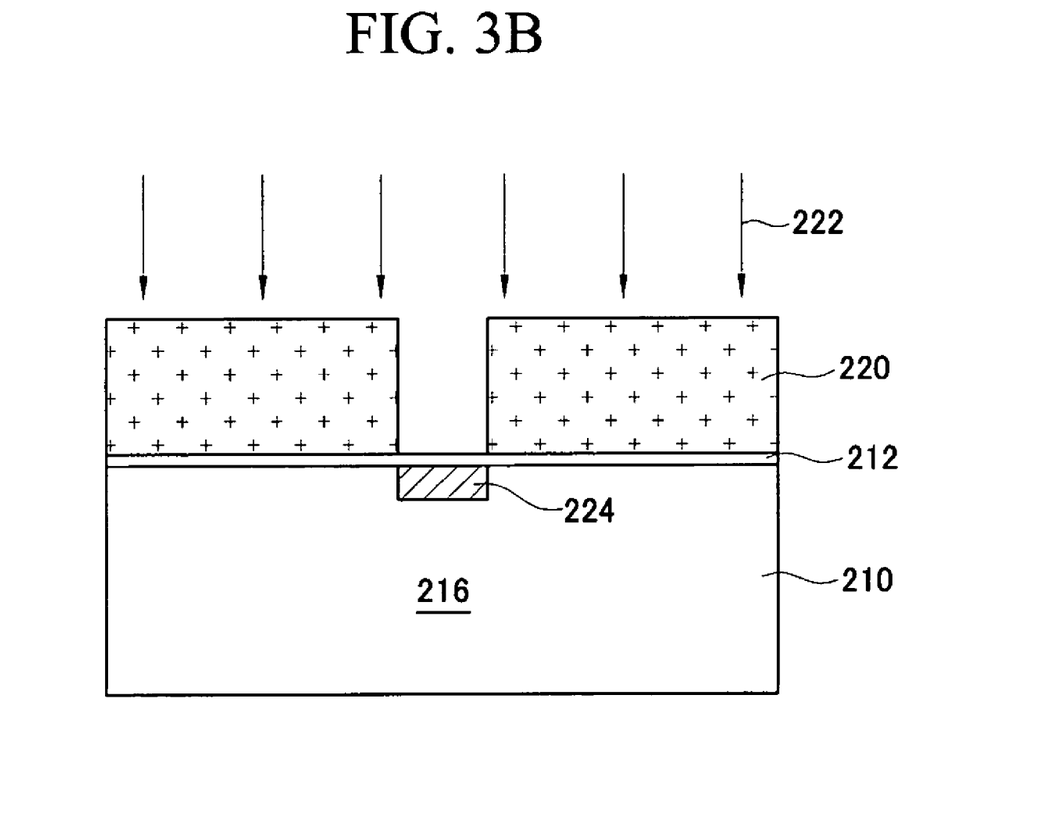
Figure 4B:
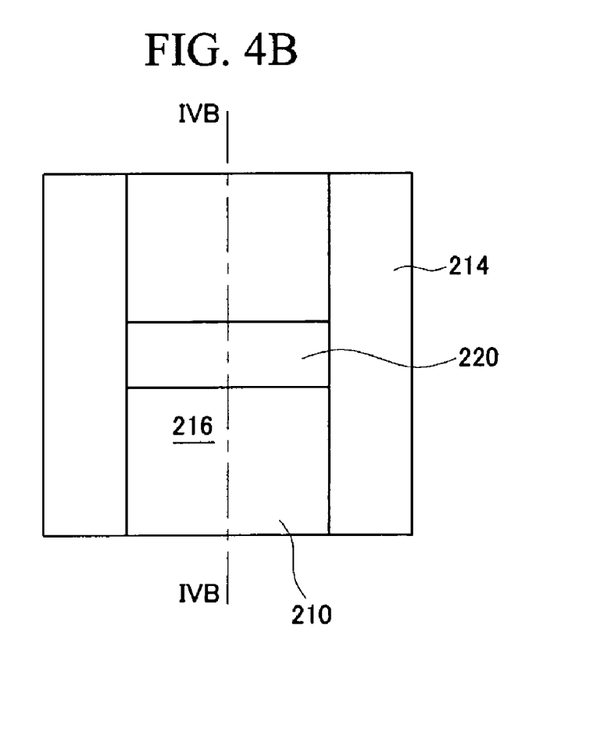

Referring to FIG. 3B and FIG. 4B, a photoresist pattern 220 is formed on the pad oxide layer 212 by performing a photolithography process, and a source region 224 is formed in the active region 216 by ion-implanting high concentration impurities 222 into the substrate 210 using the photoresist pattern 220 as a mask.

Figure 3C:
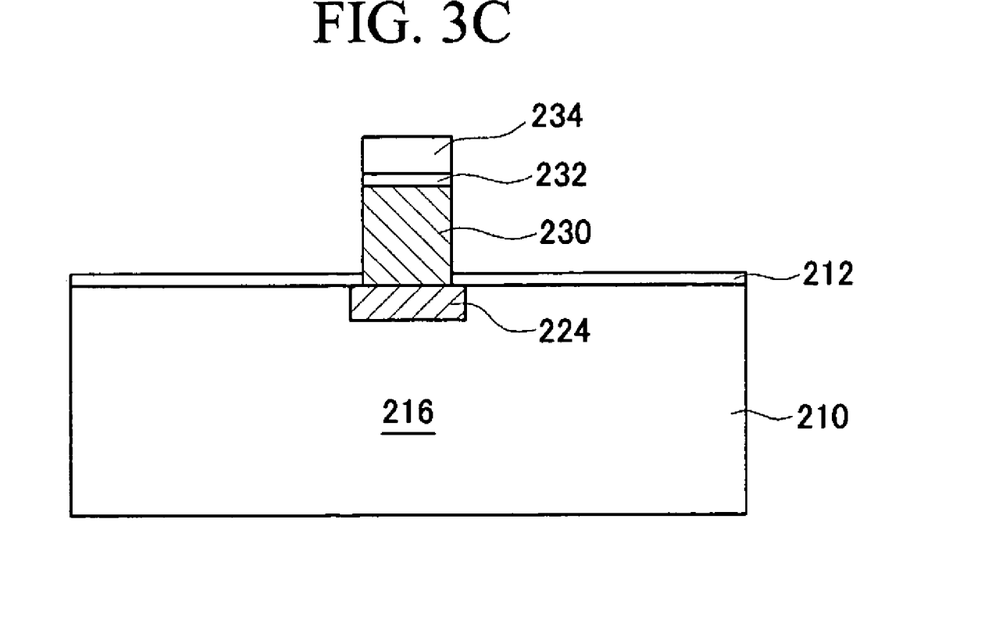
Figure 3D:
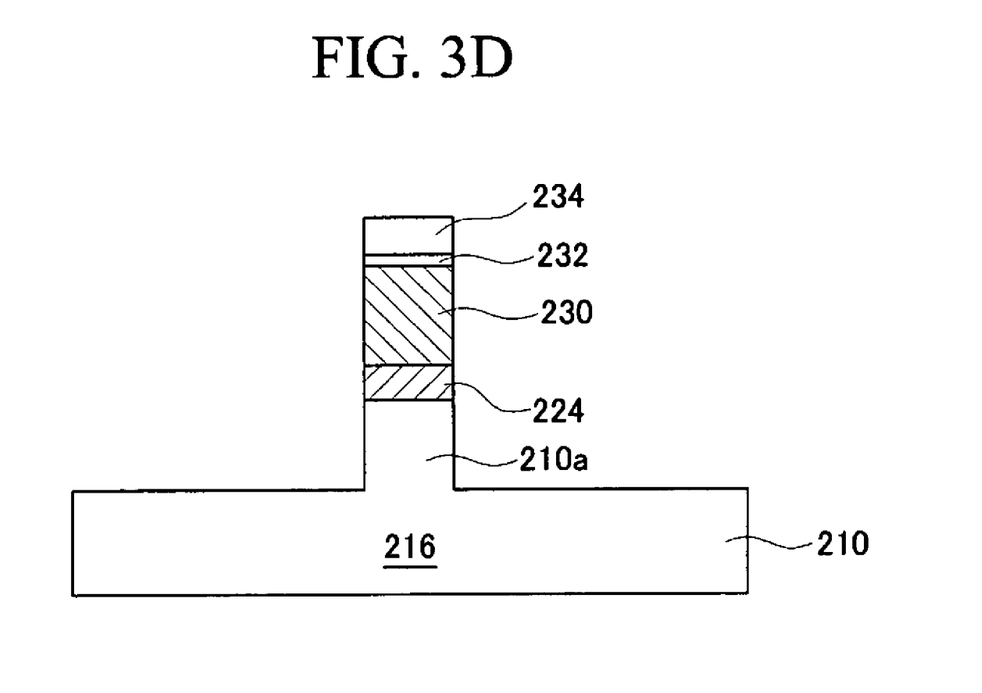
Figure 4C:
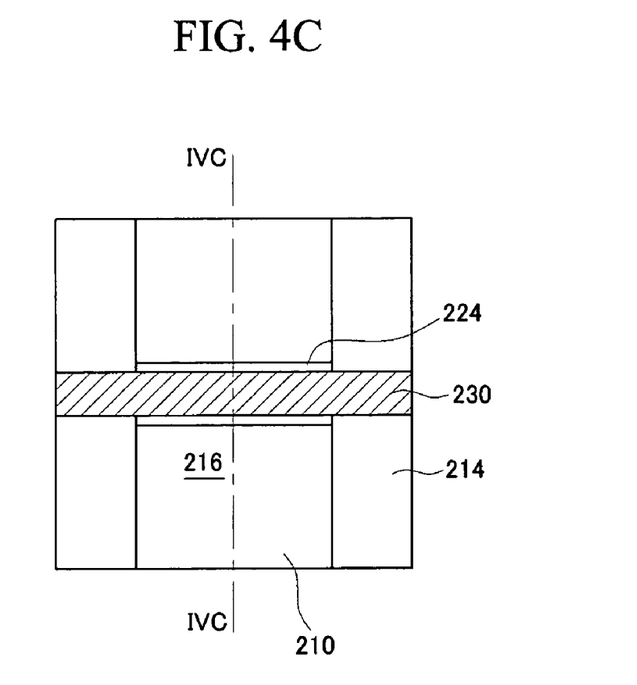
Figure 4D:
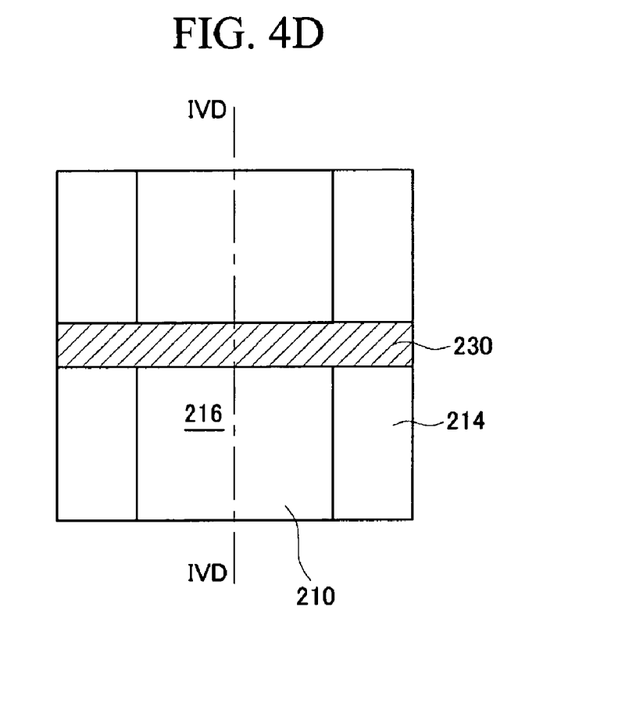

Referring to FIG. 3C and FIG. 4C, the source region 224 is exposed by removing a portion of the pad oxide layer 212 which is exposed by a photoresist pattern 220. Subsequently, the photoresist pattern 220 is removed by a well-known method, and then an annealing process is performed for activating impurities. Then, a polysilicon layer is deposited on the substrate 210 so as to contact the source region 224, and then an oxide layer and a nitride layer are sequentially deposited on the polysilicon layer.

Thereafter, a structure composed of a polysilicon layer pattern 230, an oxide layer pattern 232, and a nitride layer pattern 234 is formed by patterning the polysilicon layer, the oxide layer, and the nitride layer. Here, the nitride layer pattern 234 and the oxide layer pattern 232 perform a function of a protective layer for the polysilicon layer pattern 230 in a subsequent gate process.

Referring to FIG. 3D to FIG. 4D, the pad oxide layer 212 is removed by a well-known method, and a protruding portion 210a is formed below the source region 224 by etching a portion of the substrate 210 exposed by the structure including the polysilicon layer pattern 230, the oxide layer pattern 232, and the nitride layer pattern 234. Here, the etching depth for the exposed portion of the substrate is less than that of the source region 224.

Figure 3E:
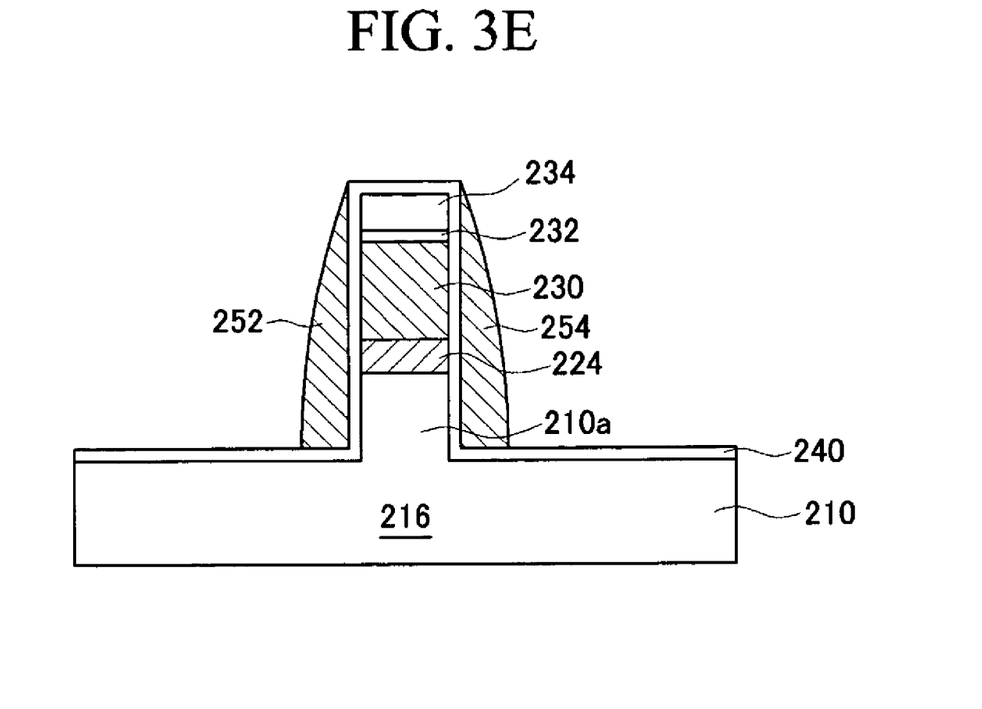
Figure 4E:
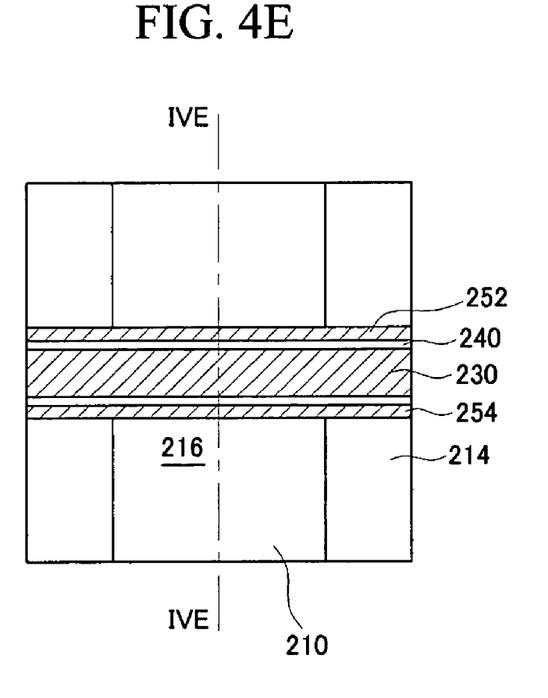

Referring to FIG. 3E and FIG. 4E, an ONO insulation layer 240 composed of a first oxide layer, a nitride layer, and a second oxide layer is formed on the entire surface of the substrate 210, and a polysilicon layer is formed on the ONO insulation layer 240. Subsequently, first and second gates 252 and 254 are formed on the insulation layer 240 at both sidewalls of the structure, at the source region 224 and the protruding portion 210a, by performing blanket etching for the polysilicon layer to a degree that the insulation layer 240 on the structure is exposed.

Figure 3F:
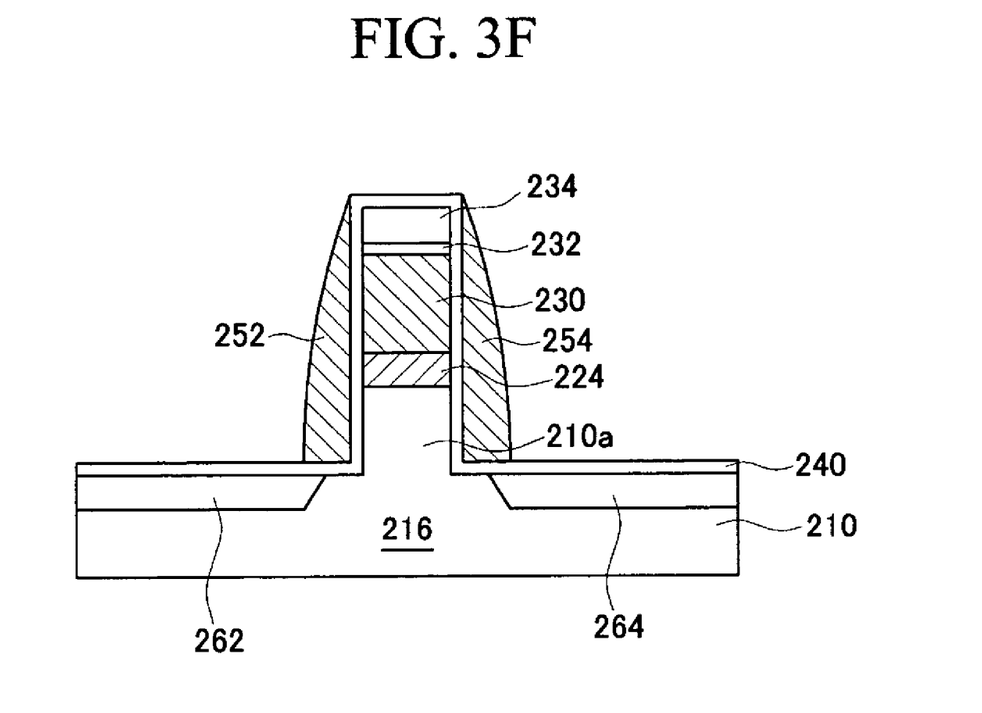
Figure 4F:
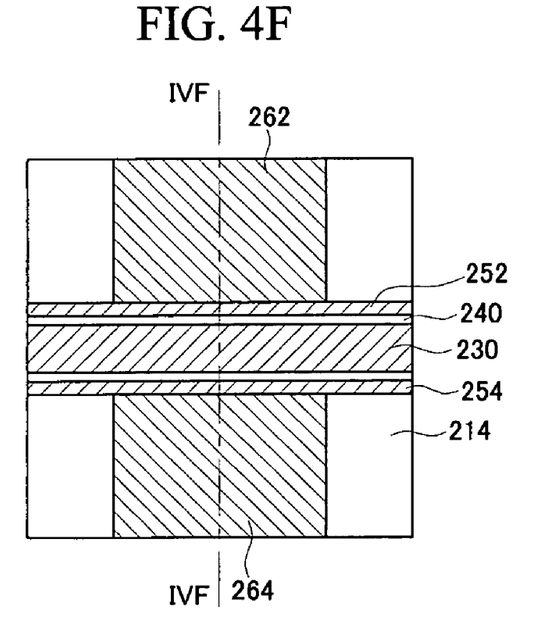

Referring to FIG. 3F and FIG. 4F, first and second drain regions 262 and 264 are formed in the active region 216 at the outside of the first and second gates 252 and 254 by implanting LDD ions into the substrate 210.

Figure 3G:
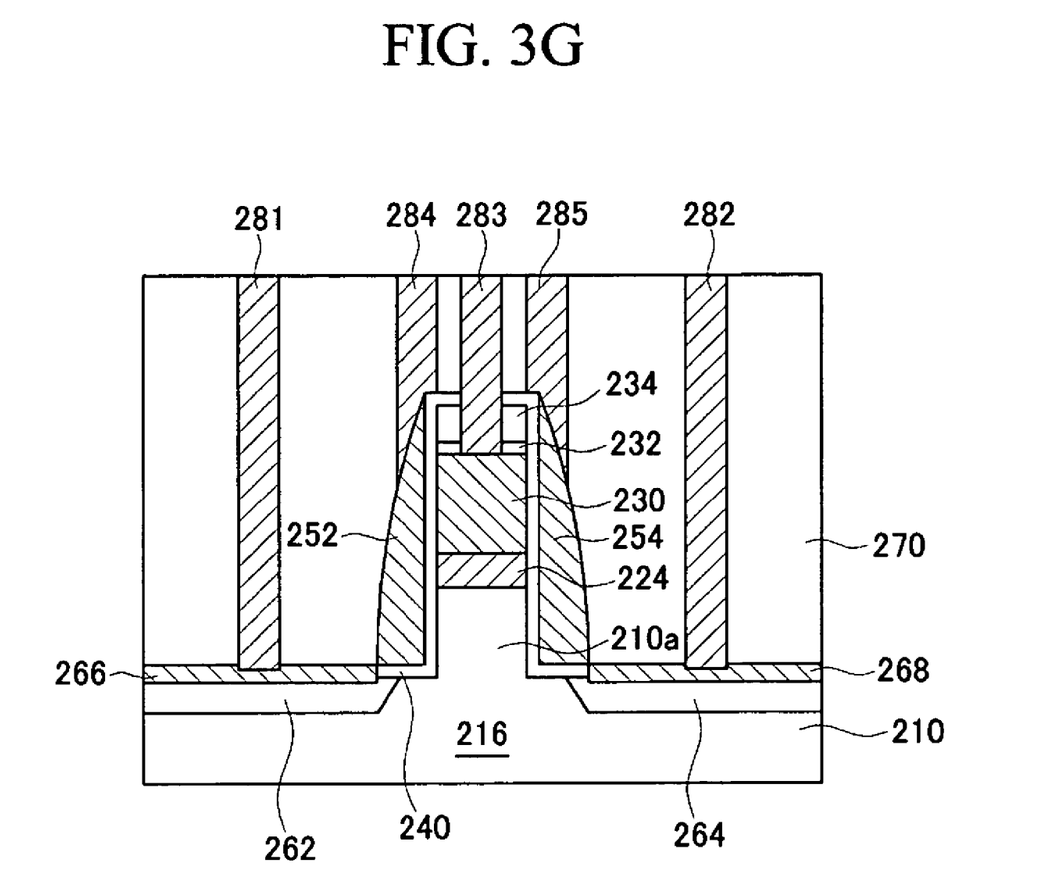
Figure 4G:
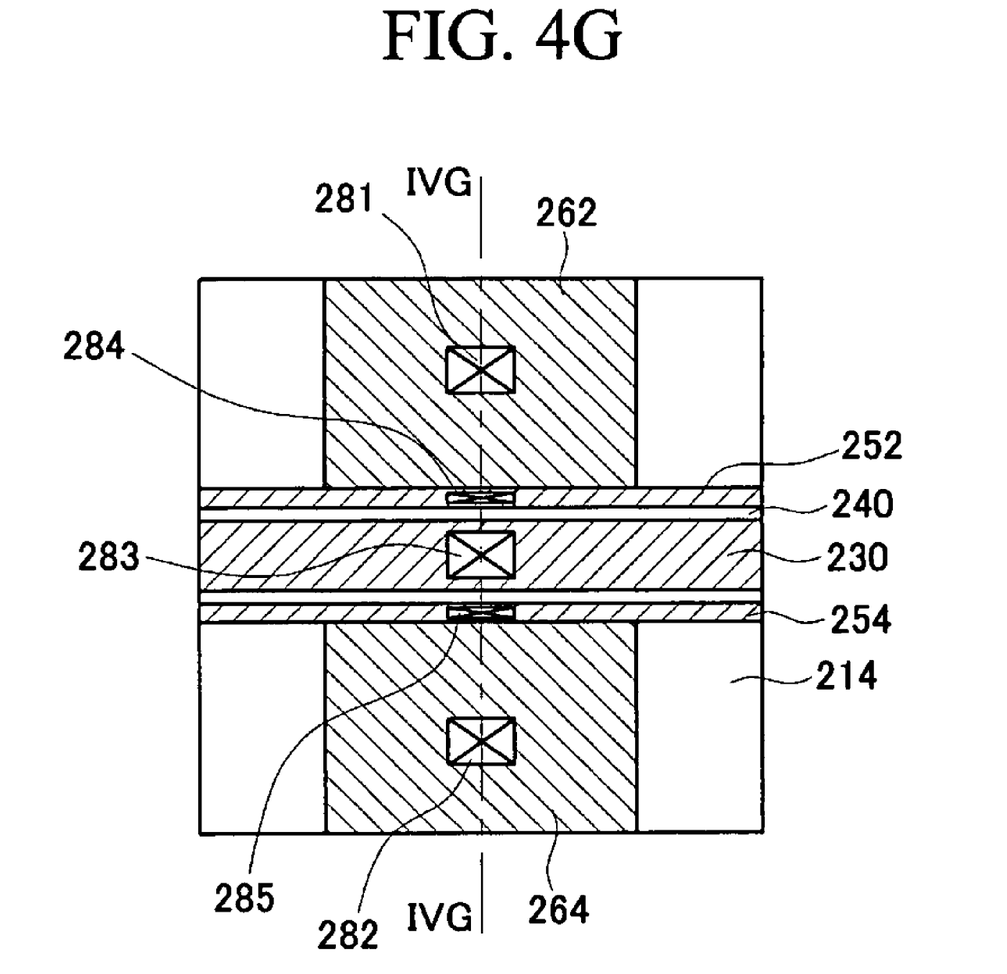

Referring to FIG. 3G and FIG. 4G, first and second silicide layers 266 and 268 are respectively formed on the first and second drain regions 262 and 264 by performing a well-known salicide process, and an interlayer insulation layer 270 is formed on the entire surface of the substrate 210.

Subsequently, first to fifth contact holes (not shown) are formed by etching: the interlayer insulation layer 270 on the first and second silicide layers 266 and 268; the oxide layer pattern 232, the nitride layer pattern 234, and the interlayer insulation layer 270 on the polysilicon layer pattern 230; and the interlayer insulation layer 270 on the first and second gates 252 and 254.

Thereafter, by filling the contact holes, first and second conductive plugs 281 and 282 are formed so as to contact with the first and second drain regions 262 and 264 through the first and second silicide layers 266 and 268, a third conductive plug 283 is formed so as to contact with the source region 224 through the polysilicon layer pattern 230, and fourth and fifth conductive plugs 284 and 285 are formed so as to contact with the first and second gates 252 and 254.

According to an exemplary embodiment of the present invention, the first and second gates 252 and 254 are symmetrically formed at both sides of the protruding portion 210a on the substrate 210 within a single cell area, and the first and second drain regions 262 and 264 sharing the source region 224 are formed at both sides of the first and second gates 252 and 254. Consequently, two memory cells are realized within the single cell area.

Therefore, when the operating voltage is applied to the first and second gates 252 and 254, memory characteristics can be realized by a trap in each interface located between the first and second gates 252 and 254 and the insulation layer 240, and between the insulation layer 240 and the substrate 210.

As described above, since a SONOS non-volatile memory device manufactured by an exemplary embodiment of the present invention can have two memory cells within a single cell area, it is easily applicable to higher integration of a semiconductor device.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A non-volatile memory device, comprising:
   a semiconductor substrate in which an active region is defined by an isolation layer and a protruding portion is formed on the active region;
   a source region formed on the protruding portion;
   first and second gates formed at both sidewalls of the protruding portion and the source region;
   a polysilicon layer pattern formed on the source region;
   first and second drain regions formed in the active region at the outside of the first and second gates; and
   an insulation layer formed between the protruding portion and the first gate, between the protruding portion and the second gate, between the source region and the first gate, and between the source region and the second gate, wherein the insulation layer is composed of a structure in which a first oxide layer, a nitride layer, and a second oxide layer are sequentially accumulated.

2. The memory device of claim 1, wherein the first and second gates and the insulation layer are formed up to the polysilicon layer pattern.

3. The memory device of claim 1, further comprising:
   an interlayer insulation layer formed on an entire surface of the substrate; and
   conductive plugs which are insulated by the interlayer insulation layer and respectively contact with the first and second drain regions, the source region, and the first and second gates.

4. The memory device of claim 3, wherein silicide layers are respectively formed on the first and second drain region before forming the interlayer insulation layer.

5. A method of manufacturing a non-volatile memory device, comprising:
   defining an active region in a semiconductor substrate by forming an isolation layer;
   forming a source region in the active region;
   forming a structure in which a polysilicon layer pattern and a protective layer are sequentially accumulated on the source region;
   forming a protruding portion below the source region by etching a portion of the substrate exposed by the structure;
   forming an insulation layer on an entire surface of the substrate;
   respectively forming first and second gates on the insulation layer at both sides of the structure, at the source region and the protruding portion; and
   respectively forming first and second drain regions on the active region at the outside of the first and second gates, wherein the insulation layer is composed of a structure in which a first oxide layer, a nitride layer, and a second oxide layer are sequentially accumulated.

6. The method of claim 5, further comprising:
   forming an interlayer insulation layer on the entire surface of the substrate;
   forming contact holes by etching the interlayer insulation layer on the first and second drain regions, the protective layer and the interlayer insulation layer on the source region, and the interlayer insulation layer on the first and second gates; and
   forming conductive plugs which contact the first and second drain regions, the source region, and the first and second gates through the contact holes.

7. The method of claim 6, wherein silicide layers are respectively formed on the first and second drain regions before forming the interlayer insulation layer.

8. The method of claim 5, wherein the protective layer is composed of a structure in which an oxide layer and a nitride layer are accumulated.

9. The method of claim 6, wherein the protective layer is composed of a structure in which an oxide layer and a nitride layer are accumulated.

* * * * *